United States Patent Office 3,551,149

Patented Dec. 29, 1970

3,551,149

METHOD OF CONDUCTING ELECTRIC CURRENT THROUGH DEVELOPED SILVER HALIDE IMAGES

George H. Nawn, Westwood, and William J. Timson, Belmont, Mass., assignors to Polaroid Corporation, Cambridge, Mass., a corporation of Delaware No Drawing. Continuation-in-part of application Ser. No. 522,827, Mar. 7, 1966. This application Jan. 23, 1969, Ser. No. 793,542

Int. Cl. G03c *5/26, 5/00, 1/02*

U.S. Cl. 96—38.4 2 Claims

ABSTRACT OF THE DISCLOSURE

Electrical energy may be conducted through a circuit comprising silver filaments interconnecting the silver grains of a developed photographic image prepared by distributing an aqueous dispersion of photosensitive silver halide in a non-gelatinous polymeric binder on a substrate and exposing and developing said silver halide for a time sufficient to provide an electrical energy-conductive circuit.

This application is a continuation-in-part of our copending U.S. application Ser. No. 522,827, now U.S. Pat. No. 3,424,581.

The present invention relates to processes particularly adapted to provide for the fabrication of novel photosensitive elements and, more particularly, to processes adapted to facilitate the conduction of electrical energy through conductive silver images produced by developing certain photosensitive emulsions having a latent image impressed thereon.

In accordance with the prior art, various photographic techniques have been employed to provide for the fabrication of an electrically conductive pattern, for example, procedures of the type set forth in U.S. Pat. No. 2,660,343, which procedures comprise, in general, the preparation of an electrically conductive pattern by initially providing a photographic latent image of the selected conductive pattern, which latent image may be impressed upon a conventional photoresponsive silver halide emulsion by any one of the conventional photographic procedures for this purpose known in the art, as, for example, by contact printing of a photographic negative upon a typical photographic positive emulsion, or projection printing; developing the resultant latent image in the usual manner, but not fixing same; immersing the developed film in a solution which selectively etches, or dissolves, the matrix containing the developed silver image, leaving exposed base material in the predetermined pattern; and then coating a conventional conductive material on the base outlined by the thus-provided stencil. Prior art procedures such as, for example, those disclosed in U.S. Pat. No. 3,006,819, comprise a method of forming electrically conducting images, for example, printed circuits and the like, by coating a suitable substrate, sequentially, with a catalytic agent which is a metallic salt having electrical conductivity and a photoresist material; selectively exposing the resist material; removing the exposed areas of the resist material by contact with a solution adapted to dissolve, or etch, the material, in order to provide exposure of the retained metallic salt; and then chemically depositing a conducting metal on the exposed surface of the metallic salt, in order to provide the desired electrically conducting configuration. Procedures of the type disclosed in, for example, U.S. Pat. No. 2,854,386, have heretofore been taught as adapted to provide the formation of electrically conducting images by selective exposure of a silver halide emulsion coated substrate, in order to provide impression of a latent image possessing the desired design parameters; developing the resulting latent image; removing the developed image by etching; exposing the remaining photoresponsive silver halide; and then treating the latter exposed silver halide with a solution containing an appropriate silver salt and reducing agent, to provide the desired electrical conducting properties to the resultant image. In further considering existing prior art processes adapted to provide for the production of electrically conducting patterns, attention should also be directed to the plurality of processes disclosed in U.S. Pat. No. 3,033,765. The disclosure of that patent sets forth a plurality of methods for accomplishing the purpose of providing an electrically conducting image. For example, a photosensitive photographic paper having a silver chloride content is disclosed to be adapted for chemical development, subsequent to photoexposure, by a monobath treatment which includes employment of a specified class of sulfur-containing organic materials, in order to provide for the formation of an electrically conducting image, in terms of the unexposed regions of the photographic paper. In addition, it is also disclosed that various types of silver halide emulsion coated photographic papers, and specifically those having silver bromide content, may be subjected to development, subsequent to photoexposure, by a monobath treatment and, as a subsequent step, subjected to a nucleating afterbath, containing nucleating agents such as soluble noble metal compounds, for example, gold chloride and the like, tin compounds, for example, stannous chloride and the like, in order to provide formation of an electrically conducting image, in terms of the unexposed regions of the photographic paper. In accordance with the last-mentioned procedure, it is further taught that electrically conducting images may be provided by imagewise diffusion of silver complex from the unexposed areas of the photoexposed photographic paper to a second, or discrete, sheet material, acting as a reception element, and which material possesses an appropriate nucleating agent, or agents, associated with the reception material.

Examination of the above-denoted art methods for producing an electrically conducting image by a photographic technique, such as those described above, indicates that all such processes require the employment of a plurality of individual steps subsequent to the photographic procedure and/or modification of the photographic procedure by the addition of special processing techniques and/or additives in order to produce an electrically conducting image pattern.

Conventional, or normal, development of a typical photoexposed gelatino silver halide photographic emulsion produces a developed silver image, as a function of the point-to-point degree of the emulsion's exposure, which silver image basically comprises conductive metallic silver but which image itself possesses substantially no electrical conductance, that is, the electrical resistivity of the developed silver image produced by a normal photographic development technique of a conventional photoexposed gelatino silver halide photographic emulsion is extremely high, generally, on the order of $10^7$ ohms/cm. or greater. Presumably, this high resistivity is the result of the fact that although the individually developed silver halide grains comprised, in a developed state, conductive metallic silver, such grains are effectively insulated from each other by the gelatin colloid binder in which the silver halide material is dispersed. Specifically, the conventional photographic binder, the universally employed protein gelatin, provides such extensive insulating capacity that, in effect, the metallic silver grains provided upon development of exposed silver halide grains are individually isolated, and thus insulated, for the purposes of efficient, and effective, conduction of electrical energy.

It was recognized in copending U.S. application Ser. No. 522,327, now U.S. Pat. No. 3,424,581, of which the instant application is a continuation-in-part, that it would be desirable to provide photographic silver images, produced by conventional photographic means, that is, by conventional development of a gelatino silver halide emulsion, which are capable of conducting electrical energy. It was disclosed therein that photoresponsive gelatino silver halide emulsions which provide developed silver images possessing a high degree of electrical conductance, when subjected to development of an impressed latent image resultant from photoexposure, may be prepared by conventional gelatino silver halide emulsion-making techniques wherein the peptizing agent employed comprises a derivatized gelatin which must be derivatized in such manner as to convert the amphoteric protein into a proteinaceous material possessing localized negative electrostatic charge. It was further disclosed that normal gelatin, that is, underivatized gelatin, employed as a peptizing agent and colloid binder in the fabrication and structure of a photoresponsive silver halide emulsion adsorbs directly, and uniformly, on the active surfaces, or faces, of the respective silver halide grains, or crystals, comprising the emulsion formulation which is generally believed to be at least partially accomplished by an unknown type of chemiadsorption between the crystal surface and the amphoteric protein, as well as by means of electrostatic charge attraction. Specifically, the surface electrostatic charge of the conventional silver halide grain comprises a negative charge per unit area over the total active surface area of the grain, and thus the amphoteric character of the gelatin facilitates, and/or at least allows, the gelatin to be at least in part electrostatically attracted to and mainained directly, and indirectly, on the grain surface, over its total active surface area. It was further disclosed that if a gelatin, which has been derivatized to the extent necessary to provide localized negative electrostatic charge centers in the polymer molecule, is employed as the colloid binder for the silver halide grains, there results, when such derivatized gelatin is adsorbed onto the negative surfaces of the silver halide grain, discontinuities, or irregularities, in the adsorbed gelatin coverage on the surfaces of the silver halide grain, as a result of localized electrostatic charge repulsion. As a result of the presence of the localized discontinuities, or irregularities, in the adsorbed gelatin surface coverage of the silver halide grain, there exist sites on the grain, upon development of a photoexposed photographic emulsion retaining such grains, which provide for the formation of metallic silver filaments extending from such grain and interconnecting directly, and indirectly, with additional grains possessing such sites. The thus produced filamentary network, comprising silver filaments directly, and indirectly, interconnecting the plurality of reduced silver halide grains comprising the developed latent image, constitutes an electrically conducting silver network and, for each emulsion, possesses a conductivity proportional to the mean exposure energy quantum incident on the emulsion per unit area.

The latter above-described process has proven to have substantial potential in fabricating printed circuits by a mechanism inherently more accurate than the heretofore discussed etching processes, etc., since the formation of conductive filamentous areas are produced by the point-to-point exposure of actinic radiation with subsequent conventional development. It has been found, however, that even that process may be simplified.

As specifically detailed in the copending U.S. application, supra, derivatization of gelatin to impart sufficient electronegativity thereto involves a substantial production procedure which is not only time consuming but adds a substantial expense to the finished product. It is additionally well known that each batch of gelatin produced has inherent photographic characteristics which must be determined by laboratory procedures before such material may be used in a given photographic environment, in order to ascertain the type and quantity of additives which will be required to provide a given, predetermined sensitometry to the photographic system.

It is, accordingly, an object of the present invention to provide a substantially non-gelatinous silver halide emulsion which is capable of, subsequent to exposure and development, conducting electrical energy.

Other objects of the present invention will in part be obvious and will in part appear hereinafter.

The invention accordingly comprises the several steps and the relation and order of one or more of such steps with respect to each of the others, and the product possessing the features, properties and the relation of elements which are exemplified in the following detailed disclosure, and the scope of the application of which will be indicated in the claims.

For a fuller understanding of the nature and objects of the invention, reference should be had to the following detailed description.

Upon completion of the experimental work itemized in the copending application, supra, it was unexpectedly discovered that certain non-gelatinous polymeric colloid binder materials for silver halides produced results equal or superior to that obtained by employing the aforementioned derivatized gelatin, and provided more flexibility in fabricating electrical energy-conducting circuits of almost any desired conductivity. For purposes of the instant invention, a developed emulsion is considered to be conductive when the resistivity thereof is less than $10^6$ ohms/cm. (greater than $10^{-6}$ mhos/cm. conductivity).

Polymeric colloid binders which may be used within the context of the instant invention are those which exhibit limited restraint on silver halide crystal growth; that is, they are not tightly absorbed to the silver halide grains. Empirically, it has been found that the restraint characteristics of various polymeric materials are directly related to the light transmissivity the solutions thereof containing silver halide grains. This phenomenon is attributed to the fact that materials with high restraining powers deleteriously affect crystal growth while those with low restraining powers allow substantial growth. Obviously, light transmission through the solution containing large grains will be less than transmission through solutions containing small grains. This technique allows the operator the latitude to predict whether a given polymeric material will lend itself to the production of an electrical energy-conducting circuit produced photographically. On an empirical basis, it has been found that polymeric, non-gelatinous silver halide solutions which display transmissivities of 90% or less in a silver chloride restrainer test, fully described below, will produce photographic electrically conducting silver halide circuits displaying a resistivity of less than $10^6$ ohms/cm.

In general, the non-gelatinous polymeric materials contemplated herein are employed in the fabrication of photoresponsive silver halide emulsions utilizing conventional emulsion-formulating techniques, discussed below, and should be used in concentrations dictated by the degree of electrical resistivity desired in the ultimate product. In general, a weight ratio of from 0.1 to 5 parts of non-gelatinous colloid binder per part of silver halide will provide acceptable results.

Various optional additives may be incorporated in the emulsions anticipated herein such as coating aids, hardeners, viscosity-increasing agents, preservatives, accelerators, and the like, according to the conventional procedures known in the photographic emulsion-manufacturing art.

The photoresponsive crystal material of the photographic emulsion will, as previously described, comprise a crystal of a compound of silver, for example, one or more of the silver halides such as silver chloride, silver iodide, silver bromide, or mixed silver halides such as silver chlorobromide or silver iodobromide, of varying halide ratiois and varying silver concentrations. The formulated photographic emulsions may be used for the preparation of orthochromatic, panchromatic, ultarviolet, X-ray, and infrared sensitive photographic films.

The fabricated emulsion may be coated onto various types of rigid or flexible supports, for example, glass, paper, metal, polymeric films of both the synthetic types and those derived from naturally occurring products, etc. Especially suitable materials include paper; aluminum; polymethacrylic acid, methyl and ethyl esters; vinyl chloride polymers; polyvinyl acetals; polyamides such as nylon; polyesters such as the polymeric films derived from ethylene glycol terephthalic acid; polymeric cellulose derivatives such as cellulose acetate, triacetate; nitrate, propionate, butyrate, acetate-butyrate, or acetate-propionate; polycarbonates; and polystyrenes.

The emulsions may include the various adjuncts, and addenda, according to the techniques disclosed in the art, such as speed increasing compounds of the quaternary ammonium type, as described in U.S. Pats. Nos. 2,271,623; 2,228,226; and 2,334,864; or of the polyethyleneglycol type, as described in U.S. Pat. No. 2,708,162; or of the preceding combination, as described in U.S. Pat. No. 2,886,436; or the thiopolymers, as described in U.S. Pats. Nos. 3,046,129 and 3,046,134.

The emulsion may also contain one or more coating aids such as saponin; a polyethyleneglycol of U.S. Pat. No. 2,831,766; a polyethyleneglycol ether of U.S. Pat. No. 2,719,087; a taurine of U.S. Pat. No. 2,739,891; a maleoprimarate of U.S. Pat. No. 2,823,123; an amino acid of U.S Pat. No. 3,038,804; a sulfosuccinamate of U.S. Pat. No. 2,992,108; or a polyether of U.S. Pat. No. 2,600,831; or a gelatin plasticizer such as glycerin; a dihydroxyalkane of U.S. Pat. No. 2,960,404; a bis-glycolic acid ester of U.S. Pat. No. 2,904,434; a succinate of U.S. Pat. No. 2,940,854; or a polymeric hydrosol of U.S. Pat. No. 2,852,386.

Optical sensitization of the emulsion's silver halide crystals may be accomplished by contact of the emulsion composition with an effective concentration of the selected optical sensitizing dye, or dyes, dissolved in an appropriate dispersing solvent such as methanol, ethanol, acetone, water, and the like; all according to the traditional procedures of the art, as described in Hamer, F. M., The Cyamine Dyes and Related Compounds (1964), Interscience Publishers, New York, N.Y.

Commensurate with the preceding discussion, it will be recognized that the aforementioned polymeric matrix materials may be replaced, in part, by gelatin during formulation of a selected emulsion with a concomitant reduction in the electrical conductance of the emulsion directly proportional to the relative amount of gelatin introduced into the emulsion system. It will be appreciated that in the event the gelatin utilized is derivatized in accordance with the disclosure of the aforementioned copending application, no concomitant reduction in electrical conductance will be experienced. In the same context, it has been established that it is not necessary to actually grow the silver halide grains in the polymeric non-gelatinous colloid binder material, but the grains may be grown in a conventional gelatin emulsion with subsequent separation therefrom, collection and dispersion of the grains in a non-gelatinous colloid binder selected by the operator to provide predetermined electrical conductivity characteristics to the ultimately produced silver image.

In general, it is believed that the described metallic silver filaments are, at least in part, provided by deposition of silver ions, derived, at least in part, from the continuous dissolution and reconstitution of silver halide crystals, or grains, as metallic silver, in filamentary form, during the development process.

It has been specifically found, however, that non-gelatinous silver halide emulsions formulated in accordance with the present invention are subject to a phenomenon which may be characterized as "spontaneous" or "filamentous infectious" development when the latent image contained in a photoexposed emulsion is subjected to development. Specifically, it has been found that a statistical number of the previously detailed silver filaments interconnect both exposed and unexposed silver halide crystals and initiate thereby development of such unexposed grains, with the concomitant result of a decrease in the potential resolution of the emulsion formulation by reason of the resultant "fog." In point of fact, the silver halide emulsions of the present invention, if not specifically stabilized, possess sufficient propensity for "infectious" development as to be substantially unacceptable for employment in conventional information storage photographic processes, such as pictorial photography and the like.

It has also been found that, with regard to silver halide emulsions formulated in accordance with the present invention, development can be substantially limited to silver halide crystals which have been exposed and thus development restricted to that of the latent image by the addition of a stabilizing amount of a conventional stabilizer and/or antifoggant. However, the addition of a stabilizing agent to the emulsion formulation provides a decrease in the electrical conductance efficiency of the image, formed upon development, in direct proportion to the stabilization afforded to the formulation by the adjunct. Thus, the concentration of stabilizer employed to provide increase resolution will be directly dependent upon the propensity of the selected emulsion for infectious development and, accordingly, empirically selected, preferably so as to constitute the minimum amount necessary to provide the minimum resolution required by the emulsion formulation's employment. The concentration of such adjuncts, however, when employed, will generally fall within the range of about 5 micrograms to 5 grams of efficient stabilizing adjunct per 100 grams of silver halide.

For an extensive listing of stabilizing adjuncts adapted for employment in the present system, reference is made to chapter XXI of Photographic Chemistry, volume 1, P. Glafkides, Fountain Press, London, England, and the subject matter commencing at page 677 of The Theory of the Photographic Process (Revised Edition—1954), C. E. K. Mees, the MacMillan Company, New York, N.Y.

Specifically, the emulsions may be stabilized with the salts of the noble metals such as ruthenium, rhodium, palladium, iridium, and platinum, as described in U.S. Pats. Nos. 2,566,245 and 2,566,263; the mercury compounds of U.S. Pats. Nos. 2,728,663; 2,728,664 and 2,728,665; the triazoles of U.S. Pat. No. 2,444,608; the azaindines of U.S. Pats. Nos. 2,444,605; 2,444,606; 2,444,607; 2,450,397; 2,444,609; 2,713,541; 2,743,181; 2,716,062; 2,735,769; 2,756,147; 2,772,164; and those disclosed by Burr in "Z. Wiss. Phot.," line 47, 1852, pages 2–28; the disulfides of Belgian Pat. No. 569,317; the zinc and cadmium salts of U.S. Pat. No. 2,839,405. Particularly good results have been achieved with 7-hydroxy-triazaindolazine.

The photoexposed emulsion may be developed by any of the conventional developing procedures known in the art to be adapted to effect reduction of the photoexposed silver halide crystal. In general, development will be effected by contact of the photoexposed emulsion with a solution containing a conventional developing agent such as one, or more, of the conventional developing agents, and compositions of same, set forth in chapter 14 of The Theory of the Photographic Process, supra, and chapters VI, VII, VIII and IX, of Photographic Chemistry, volume 1, supra. The preferred developing agents generally comprise organic compounds and, in particular, constitute organic compounds of the aromatic series containing at least two hydroxyl and/or amino groups, wherein at least one of the groups is in one of ortho and para position with respect to at least one other of the groups, such as, for example, the various known hydroquinones, p-aminophenols, p-phenylenediamines, and their various known functional analogues. The developing composition will preferably comprise an aqueous solution of an alkaline material such as sodium hydroxide or sodium carbonate or the like containing one or more specific silver halide developing agents, such as p-methylaminophenol; 2,4-diaminophenol; p-benzylaminophenol; hydroquinone; toluhydroquinone, phenyl hydroquinone, 4'-methylphenylhydroquinone, etc. It will be recognized that the developing agent may be initially incorporated in the liquid processing composition and/or incorporated, at least in part, in any one, or more, of the strata constituting the photoresponsive element retaining the emulsion and solubilized by contact with an appropriate fluid medium for effecting development of the photoexposed emulsion. The developing composition may be contacted with the photoexposed emulsion according to any of the conventional tray, tank, and the like, procedures, and may optionally contain preservatives, alkalis, restrainers, accelerators, etc., other than those specifically mentioned hereinbefore. Similarly, the concentration of the various components may be varied over a wide range and, where desirable, any one, or more, of such components may be disposed in the photosensitive element, prior to exposure, in a separate permeable layer of the element and/or in the photosensitive emulsion itself.

For the purpose of stabilizing the developed image, the emulsion may be fixed according to any of the conventional fixing, washing and/or drying procedures known in the art as, for example, those described in chapter XI of Photographic Chemistry, volume 1, supra, and chapter 17 of The Theory of the Photographic Process, supra. For example, the element retaining the developed image may be initially contacted with a stop bath adapted to terminate action of the developing agent, on the photosensitive emulsion, by changing the pH to that at which the selected silver halide developing agent exhibits substantially no developing potential. Specifically, where the silver halide developing agent is an organic compound exhibiting its developing action at an alkaline pH, for example, a hydroquinone, or the like, the element may be subjected to an acid stop bath for a sufficient time interval as to neutralize the silver halide developing potential of the selected developing agent. The element may then be subjected to a fixing bath in order to effect removal of unexposed photoresponsive silver halide from the emulsion, according to the conventional procedures known to the art as adapted to effect same. Specifically, the fixing agent generally employed will comprise a sodium thiosulfate bath which is effective to remove substantially all types of silver halides from disposition in the silver halide emulsion strata and which agent itself does not attack the previously developed silver image. Subsequent to fixation all residual traces of the fixing agent may be removed by aqueous washing, in order to insure permanency of the developed image.

The present invention will be illustrated in conjunction with the following procedures which set out representative embodiments illustrating fabrication and utilization of the photoresponsive elements of the present invention, which, however, are not limited to the details therein set forth and are intended to be illustrative only.

STEP 1—SILVER CHLORIDE RESTRAINER TEST

As alluded to above, the critical determining factor in predicting the propensity of a given emulsion comprising a non-gelatinous polymeric colloid binder material to provide an electrical energy-conducting silver image is light transmissivity through a dilute aqueous solution of an emulsion formulated with said material. The test is conducted in the following manner:

(a) 5 ml. of a 1 percent aqueous solution of a polymer which is to be evaluated is placed in a test tube in an 80° C. water bath for five minutes.

(b) To this is added 2 ml. of 0.06 N sodium chloride and heating is continued for about 10 minutes.

(c) 2 ml. of 0.01 N silver nitrate is next added at 80° C. and the mixture is allowed to stand at that temperature to grow crystals of silver chloride for eight minutes.

(d) To 2 ml. of the resultant solution is added 10 ml. of cold water and, after mixing, the transmission density is measured using a Bausch and Lomb Spectronic 20 spectrophotometer across a one centimeter path length with 570 mμ light.

It will be evident from an evaluation of the above test procedure that the polymeric binder materials which may be used in the context of the present invention comprise a non-gelatinous polymeric material being characterized in that a 0.56 percent aqueous solution thereof containing $4.4\times10^{-3}$ molar silver chloride with $2.6\times10^{-2}$ molar excess chloride will, after eight minutes of crystal growth at 80° C. and subsequent dilution of one part thereof with five parts of water, possess a light transmittance of 570 mμ light of less than 90% across a one centimeter path length.

STEP 2—EMULSION MANUFACTURE

Any conventional emulsion-making technique may be utilized. However, the following procedure was utilized in the production of the exemplary data reproduced below.

15 ml. of a solution comprising 193 gms. ammonium bromide; 7 gms. potassium iodide; and 500 ml. water and 30 ml. of a 5 percent aqueous solution of a selected polymer were mixed at 60° C. To this was sequentially added three 20 ml. aliquots of a 10 percent aqueous silver nitrate solution. The crystals were allowed to grow for one hour at 60° C. The emulsion was then dialyzed in water for about three hours; allowed to settle; and the supernate was decanted. To the emulsion was added 30 additional ml. of a 10 percent polymer solution at 0.001 N potassium bromide concentration.

The resultant emulsion was next coated onto a cellulose triacetate substrate at a coverage of about 200 mg. of silver per square foot—which is, by no means, critical.

Alternatively, the silver nitrate may also be desirably added as one 20 ml. aliquot and 8 sequentially added 5 ml. aliquots over a period of 20 minutes. The crystals are allowed to grow for one hour at 60° C., after which the emulsion is then adjusted to pH 3 with 1 N sulfuric acid, and the precipitate is washed to a water conductivity of 400 micromhos. The pH is then adjusted to 5.5 and the pAg adjusted to 9.1. All other steps of the emulsion-making and coating procedures are as described above.

STEP 3—EXPOSURE AND DEVELOPMENT

The coated emulsion is next exposed to a given radiation pattern and then developed by contacting the exposed emulsion for 5 minutes at about 68° F. with DK 60A (trade name of Eastman Kodak Company, Rochester, N.Y., for a developer formulation comprising 2.5 g. of p-methylaminophenol sulfate, 50 g. of sodium sulfite, 2.5 g. of hydroquinone, 20 g. of Kodalk [trade name of Eastman Kodak Company for the alkali forming the subject matter of U.S. Pat. No. 1,976,299], 0.5 g. of potassium bromide and sufficient water to provide 1 liter of developer composition). The emulsion was then short-stopped by contact for 30 seconds at about 68° C. with a short-stop solution comprising 533 cc. of 28% acetic acid in 3.3 gallons of water and then fixed by contact for about 10 minutes at about 68° C. with an acid fixing composition comprising 250 g. of sodium thiosulfate, 15 g. of sodium sulfite, 48 cc. of 28% acetic acid, 7.5 g. of boric acid, 15 g. of potassium alum, and sufficient water to provide a composition comprising 1 liter. The developed emulsion was then washed for 30 minutes with water and dried by contact with circulating air for 45 minutes, at a temperature of about 120° F.

EXAMPLE

Using the above-described procedures, the transmissivity of various non-gelatinous polymeric material-silver halide dispersions was ascertained using the technique described above. Emulsions comprising such polymers were then prepared and coated on a cellulose triacetate substrate at a coverage of about 200 mg. silver per square foot and the electrical resistivity was measured. The following tabulation depicts the transmissivities and electrical conductivities obtained with various non-gelatinous polymeric matrices, in each instance the emulsion being formulated as described above and the electrical conductivities being measured using a standard ohm meter with a one centimeter gap between electrodes.

| | Percent transmittance | Electrical resistivity, ohms/cm. |
|---|---|---|
| Polymer: | | |
| Elvanol [1] 71-30 | 93 | $10^{6}+$ |
| K-30 [2] | 15 | $10^{5}$ |
| K-90 [3] | 68 | $10^{5}$ |
| Dextran sulfate | 0 | 15 |
| Amberlak 165 [4] | 57 | 50 |
| Elvanol [5] 76-200 | 95 | $10^{6}+$ |
| Acrysol G.S. [6] | 29 | $10^{5}$ |
| Elvanol [7] 72-600 | 100 | $10^{6}$ |
| Methocell [8] | 0 | 15 |
| Reten 205L [9] | 10 | $5\times10^{4}$ |
| Sodium alginate | 0 | $1.5\times10^{4}$ |

[1] E. I. du Pont de Nemours and Co., polyvinyl alcohol, 99% hydrolyzed acetate groups. 30 Hopler viscosity of a 4% solution.
[2] General Aniline Fiber Corp. polyvinyl pyrrolidone, M.W. 40,000.
[3] General Aniline Fiber Corp. polyvinyl pyrrolidone M.W. 360,000.
[4] Rohm & Haas water soluble ammonium salt of a polyphenolic resin.
[5] E. I. du Pont de Nemours & Co., polyvinyl alcohol, 99.9% hydrolyzed acetate groups, 200 Hopler viscosity of 4% solution.
[6] Rohm & Haas sodium polyacrylate, Brookfield viscosity of 3% solution is 415 centipoises.
[7] E. I. du Pont de Nemours & Co., polyvinyl alcohol, 99.9% hydroyzed acetate groups. 60 Hopler viscosity of 4% solution.
[8] Dow Chemical Co. methoxy cellulose with a methyl substitution of between 1.64 and 1.92 percent.
[9] Hercules Powder Co. cationic polyacrylamide.

It will be evident from an evaluation of the above data that those materials that meet the requisite characterization determined by the silver chloride restrainer test produce electrical energy-conductive silver images with a conductivity of at least $10^{-6}$ mhos/cm. Appropriate polymers for use herein include dextran; modified dextran, e.g., dextran sulfate; methyl cellulose; hydroxy-methyl cellulose; hydroxyethyl cellulose; carboxymethyl cellulose; gum arabic; guar gum; alginates; starches; lecithin; deacetylated chitin acid salt; polyvinyl pyrrolidone; acrylamide polymers; carboxypolymethylene; polyvinyl acetate; copolymers of various polymers, such as polyvinyl alcohol, polyvinyl pyrrolidone, etc.

The electrically conducting silver images or matrices produced in accordance with the practice of the present invention posses specific utility as electronic circuits. Optionally, the matrix may be further strengthened and modified by electro-chemical deposition of the various metallic, perferably electrically conductive, elements such as additional silver, copper, platinum, gold, zinc, cadmium and the like, which in turn will strengthen the matrix as a function of the dimensional stability provided by the selected quantum deposited and property modification in accordance with the respective properties of the element and concentration of same integrated in the matrix. The polymer in contiguous relationship with the silver matrix may be removed by thermal destruction and/or appropriate solvent contact. Optionally, the silver matrix also may be imbided, or infused, with an insulating substance such as the various silicates, silicones, and the like, prior to and/or subsequent to removal of the polymer matrix. Fusion and compression of the resultant structure may then be employed to provide a wafer containing the electrically conducing silver matrix for the various utilizations employed in microelectronic circuitry. Where desired, further electronic components such as capacitors, resistors, transistors, and the like, may be incorporated as a constituent component of the electrically conducting silver matrix by appropriate positioning and/or integration prior to formation of the silver matrix itself and/or subsequent to final fabrication of same.

In contradistinction to current printed electronic circuits, produced by present industrial methods, which printed circuits are basically circuits existing in a single plane, the present invention provides a method of simultaneously fabricating a plurality of selectively positioned separate and/or integrated electronic circuits in a plurality of planes by the following illustrative procedure. For example, a multiplayered element comprising a plurality of the herein described silver halide emulsions, preferably at least two of said emulsions, most preferably in laminate form, may be fabricated as an element wherein any one or more of the respective emulsion is optically (spectrally) sensitized, according to the procedure described above, to electromagnetic radiation of selected wave lengths differing from any one or more of the remaining emulsion units, that is, having predominant spectral sensitivity to separate regions of the electromagnetic spectrum, for example, one or more emulsion units sensitized to the red region of the visible spectrum, one or more emulsion units sensitized to the green region of the visible spectrum, one or more emulsion units sensitized to the blue area of the visible spectrum, and the like. The respective differentially sensitized emulsion components may then be simultaneously and/or sequentially exposed to the selected radiation pattern, corresponding to the particular electronic configuration desired, at the particular radiation wave lengths to which the selected emulsion component desired to be exposed is responsive. The multilayered element then containing the selected plurality of latent images may be developed according to the photographic technique disclosed hereinbefore to produce an integrated electrical energy conductive matrix.

Additional applications will occur to those skilled in the various arts to which the present invention relates; accordingly, such applications are intneded to be within the spirit and scope of the present invention.

The instant mechanism of "filamentous infectious" development, wherein silver filaments emanating from a developing silver halide crystal induce neighboring grains to undergo development, is to be distinguished from "chemical infectious" development in which silver halide developing agent oxidation products induce development of neighboring grains.

Throughout the specification the term "non-gelatinous" has been employed. Such term is not intended to be descriptive of the physical form of the polymeric material described, but connotes the exclusion of gelatin from the class of materials encompassed by the present invention as colloid binders.

Since certain changes may be made in the above process and product without departing from the scope of the invention herein involved, it is intended that all matter contained in the above description shall be interpreted as illustrative and not in a limiting sense.

What is claimed is:

1. A method of conducting electrical energy which comprises coating onto a support at least two silver halide emulsions comprising at least two selectively sensitized aqueous dispersions of photosensitive silver halide crystals having predominant spectral sensitivity to separate regions of the electromagnetic spectrum, each of said dispersions of silver halide crystals being distributed in a colloid binder comprising a non-gelatinous polymeric material characterized in that a 0.56 percent aqueous solution thereof containing $4.4\times10^{-3}$ molar silver chloride with $2.6\times10^{-2}$ molar excess chloride will, after eight minutes of crystal growth at 80° C. and subsequent dilution of one part thereof with 5 parts of water, possess a light transmittance of 570 mμ light of less than 90% across a one centimeter path length, exposing said silver halide emulsions to separate electromagnetic radiation patterns at radiation wave lengths at which said emulsions are responsive, simultaneously developing said exposed silver halide emulsions with a silver halide developing agent for a time sufficient to provide development of each of said emulsions to a silver image and formation of silver filaments interconnecting the silver grains constituting said developed image and impressing an electrical current on said developed silver halide emulsions.

2. A method of conducting electrical energy which comprises coating onto a support a silver halide emulsion comprising an aqueous dispersion of photosensitive silver halide crystals distributed in a colloid binder comprising a non-gelatinous polymeric material characterized in that a 0.56 percent aqueous solution thereof containing $4.4\times10^{-3}$ molar silver chloride with $2.6\times10^{-2}$ molar excess chloride will, after eight minutes of crystal growth at 80° C. and subsequent dilution of one part thereof with 5 parts of water, possess a light transmittance of 570 mμ light of less than 90% across a one centimeter path length, exposing and developing said exposed silver halide emulsion with a silver halide developing agent for a time sufficient to provide development of said emulsion to a silver image and formation of silver filaments interconnecting the silver grains constituting said developed image and impressing an electrical current on said developed silver halide emulsion.

References Cited

UNITED STATES PATENTS

| | | | |
|---|---|---|---|
| 1,867,301 | 7/1932 | Baker | 96—69X |
| 3,003,875 | 10/1961 | Ryan | 96—114.3X |
| 3,038,800 | 6/1962 | Luckey et al. | 96—114X |
| 3,047,392 | 7/1962 | Scott | 96—114X |
| 3,203,804 | 8/1965 | Cohen et al. | 96—114.3X |
| 3,227,553 | 1/1966 | Kyoto-Shi et al. | 96—38.4X |
| 3,288,607 | 11/1966 | Middleton | 96—36.2X |
| 3,338,716 | 8/1967 | Gardner et al. | 96—114.3X |

OTHER REFERENCES

Bate et al.: "Photo-Printed Film Circuitry," IBM Tech. Disclosure, vol. 6, No. 3, August 1963, p. 6.

GEORGE F. LESMES, Primary Examiner

R. E. MARTIN, Assistant Examiner

U.S. Cl. X.R.

96—36.2, 63, 69, 85, 86, 87, 114, 114.3, 114.5, 114.7; 250—60; 117—34